(12) United States Patent
Costa-Domingues et al.

(10) Patent No.: US 8,179,183 B2
(45) Date of Patent: May 15, 2012

(54) LOW-CONSUMPTION SWITCHED-CAPACITOR CIRCUIT

(75) Inventors: Christian Costa-Domingues, Pontcharra (FR); Laetitia De Rotalier, Grenoble (FR)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 12/478,906

(22) Filed: Jun. 5, 2009

(65) Prior Publication Data
US 2009/0302934 A1 Dec. 10, 2009

(30) Foreign Application Priority Data

Jun. 6, 2008 (FR) ...................................... 08 53748

(51) Int. Cl.
G06F 7/64 (2006.01)
(52) U.S. Cl. .......... 327/337; 327/534; 327/554; 330/69; 330/258; 333/173
(58) Field of Classification Search .................. 327/337, 327/534, 554; 330/69, 258, 9; 333/173
See application file for complete search history.

(56) References Cited

U.S. PATENT DOCUMENTS

| 5,475,337 | A | * | 12/1995 | Tatsumi | 327/551 |
| 6,509,790 | B1 | | 1/2003 | Yang | |
| 6,573,785 | B1 | * | 6/2003 | Callicotte et al. | 330/9 |
| 2002/0089366 | A1 | | 7/2002 | Gupta | |

FOREIGN PATENT DOCUMENTS

| JP | 61052018 A | 3/1986 |
| JP | 63299406 A | 12/1988 |

OTHER PUBLICATIONS

Search Report for French Patent Application No. 08/53748 issued Jan. 27, 2009.

* cited by examiner

*Primary Examiner* — Lincoln Donovan
*Assistant Examiner* — Shikha Goyal
(74) *Attorney, Agent, or Firm* — Vedder Price PC

(57) ABSTRACT

A switched-capacitor circuit including at least one first capacitor and a circuit for switching at least one armature of the first capacitor alternately to one and the other of two terminals at a switching frequency. The circuit further includes a second capacitor connected to the first capacitor at a node; and a filtering circuit connecting the node to a virtual ground only for frequencies belonging to a frequency range.

23 Claims, 3 Drawing Sheets

LOW-CONSUMPTION SWITCHED-CAPACITOR CIRCUIT

BACKGROUND OF THE INVENTION

1. Field of the Invention

The present invention relates to switched-capacitor circuits and more specifically to switched-capacitor circuits of very high resolution.

2. Discussion of the Related Art

A switched-capacitor circuit comprises at least one capacitor having at least one armature alternately connected, at a switching frequency, to one or the other of two terminals by switches. In operation, the assembly formed by the capacitor and the associated switches has an equivalent resistance equal to the ratio of the switching period to the capacitance of the capacitor. Switched-capacitor circuits have many advantages. They enable to simulate a variable resistance which depends on the switching frequency. This is the reason why switched-capacitor circuits are especially used for the forming of filters having a cut-off frequency depending on the switching frequency. Further, for equivalent manufacturing technologies, a switched-capacitor circuit takes up a smaller surface area when integrated than that which would be taken up by an equivalent circuit formed with real resistors. Further, for equivalent manufacturing technologies, the capacitance of an integrated capacitor may be obtained with an accuracy greater than that of a resistor.

The current tendency is to form switched-capacitor circuits of very high resolution, that is, for which the signal-to-noise ratio or SNR is greater than some hundred decibels. For a conventional switched-capacitor circuit, this requires increasing the capacitances of the circuit capacitors up to values that can exceed several hundreds of picofarads. The capacitance increase of the capacitors translates as an unwanted increase of the total consumption of the switched-capacitor circuit. It is further generally difficult to integrate capacitors with high capacitances.

SUMMARY OF THE INVENTION

The present invention aims at a switched-capacitor circuit enabling to obtain a high SNR while maintaining a low consumption.

Another object of the present invention is the forming of a switched-capacitor circuit taking up a decreased surface area when it is made in integrated form.

For this purpose, the present invention provides a switched-capacitor circuit comprising at least one first capacitor and a circuit for switching at least one armature of the first capacitor alternately to one or the other of two terminals at a switching frequency. The circuit further comprises a second capacitor connected to the first capacitor at a node and a filtering circuit connecting the node to a virtual ground only for frequencies belonging to a frequency range.

According to an embodiment, the filtering circuit is capable of connecting the node to the virtual ground only for frequencies smaller than a threshold frequency greater than half the switching frequency.

According to an embodiment, the filtering circuit comprises an amplifier with differential inputs having an input connected to the node and having a main cut-off frequency, the threshold frequency of the filtering circuit corresponding to the main cut-off frequency.

According to an embodiment, the filtering circuit comprises at least one active filter comprising at least one active electronic component and at least one passive filter comprising at least one passive electronic component.

According to an embodiment, the capacitance of the second capacitor is smaller than the capacitance of the first capacitor.

According to an embodiment, the first capacitor comprises first and second armatures, the circuit comprising first, second, and third terminals; a first switch connecting the first terminal to the first armature of the first capacitor; a second switch connecting the second terminal to the first armature of the first capacitor; a third switch connecting the third terminal to the second armature of the first capacitor; and a fourth switch connecting the node to the second armature of the first capacitor, the first and fourth switches being controlled by a first binary signal and the second and third switches being controlled by a second binary signal, the first and second binary signals being non-overlapping.

According to an embodiment, the filtering circuit comprises an operational amplifier comprising an input connected to said node and an output connected to said input via the second capacitor, the threshold frequency of the filtering circuit corresponding to the cut-off frequency of the operational amplifier.

According to an embodiment, the second terminal is connected to a source of the reference voltage and the operational amplifier comprises an additional input connected to said source of the reference voltage.

According to an embodiment, the circuit further comprises a fifth switch across the second capacitor, the fifth switch being on, when the first and fourth switches are on, for a first time period and off for a second time period.

According to an embodiment, the circuit further comprises a third capacitor comprising third and fourth armatures, the operational amplifier comprising an additional input connected to an additional node and an additional output connected to the additional input via a fourth capacitor; fourth and fifth terminals; a sixth switch controlled by the first signal connecting the fourth terminal to the third armature of the third capacitor; a seventh switch controlled by the second signal connecting the fifth terminal to the fourth armature of the third capacitor; and an eighth switch controlled by the first signal connecting the additional node to the fourth armature of the third capacitor, the second terminal being located between the third armature of the third capacitor and the fifth switch.

The foregoing objects, features, and advantages of the present invention will be discussed in detail in the following non-limiting description of specific embodiments in connection with the accompanying drawings.

DETAILED DESCRIPTION

Figure 1:
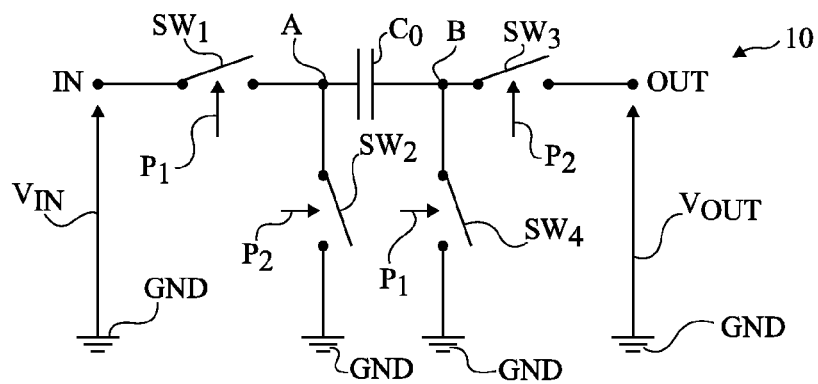
FIG. 1 schematically shows a conventional embodiment of a switched-capacitor circuit.

For clarity, the same elements have been designated with the same reference numerals in the different drawings. Further, in the following description, the same reference is used to designate a capacitive element, or capacitor, and its capacitance, and the same reference is used to designate a resistive element, or resistor, and the value of its resistance. Further, "switched-capacitor circuit" is used in a general sense and may designate a circuit comprising a single capacitor having at least one of its armatures switched between two terminals.

FIG. 1 shows a conventional example of a switched-capacitor circuit 10 comprising an input terminal IN and an output terminal OUT. Call $V_{IN}$ the voltage between terminal IN and a source of a reference voltage, for example, ground GND, and $V_{OUT}$ the voltage between terminal OUT and ground GND. Circuit 10 comprises a capacitor $C_0$ having an armature connected to a node A and its other armature connected to a node B. Node A is connected to terminal IN via a switch $SW_1$ controlled by a control signal $P_1$. Node A is further connected to ground GND via a switch $SW_2$ controlled by a control signal $P_2$. Node B is connected to terminal OUT via a switch $SW_3$ controlled by signal $P_2$. Node B is further connected to ground GND via a switch $SW_4$ controlled by signal $P_1$. As an example, control signals $P_1$ and $P_2$ are binary signals alternating between a high state, noted "1", and a low state, noted "0". As an example, when signal $P_1$ is at "1" (signal $P_2$ at "0"), switches $SW_1$ and $SW_4$ are on and switches $SW_2$ and $SW_3$ are off. When signal $P_1$ is at "0" (signal $P_2$ at "1"), switches $SW_1$ and $SW_4$ are off and switches $SW_2$ and $SW_3$ are on. Signals $P_1$ and $P_2$ are non-overlapping, that is, they are not simultaneously in the state for which they control the turning-on of the associated switch (the high state in the present example). However, signals $P_1$ and $P_2$ may be simultaneously in the state for which they control the turning-off of the associated switches (the low state in the present example). As an example, signals $P_1$ and $P_2$ are complementary, that is, signal $P_1$ is in the low state when signal $P_2$ is in the high state and conversely. As an example, signals $P_1$ and $P_2$ are periodic with a frequency $f_S$ (called switching frequency or sampling frequency hereafter) and a period $T_S$. Call α the duty cycle of signal $P_1$. This means that over a time period $T_S$, signal $P_1$ is in the high state for duration $\alpha T_S$ and in the low state for duration $(\alpha-1)T_S$, α being strictly smaller than 1. As an example, α is equal to ½.

Conventionally, circuit 10 is equivalent to a resistor R placed between terminals IN and OUT and having a resistance equal to:

$$R = T_S/C_0 = 1/(C_0 f_S) \quad (1)$$

Figure 2:
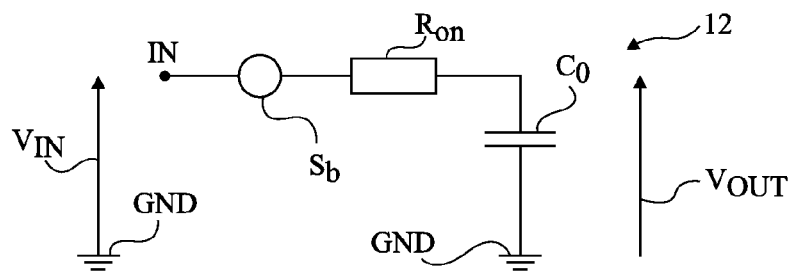
FIG. 2 shows an electric circuit used to model the noise transfer function of the circuit of FIG. 1.

FIG. 2 shows a circuit 12 equivalent to the circuit 10 used to estimate the noise power spectral density at the output of circuit 10. In the case where switches $SW_1$ and $SW_4$ are formed of MOS transistors, it can be considered that, when switches $SW_1$ and $SW_4$ are on, circuit 10 is equivalent to a source $S_b$ of a thermal noise in series with a resistor $R_{ON}$ which corresponds to the internal resistance of MOS transistors in the on state. Voltage $V_{IN}$ provided by noise source $S_b$ is filtered by a low-pass filter formed by resistor $R_{ON}$ and capacitor $C_0$ and having the following transfer function H:

$$H = \frac{1}{1 + j\frac{f}{f_C}} \quad (2)$$

where $f_C$ is the cut-off frequency of the low-pass filter and is equal to:

$$f_C = 1/2\pi R_{ON} C_0 \quad (3)$$

It is considered that cut-off frequency $f_C$ is much higher than sampling frequency $f_S$, to obtain a proper charge of capacitor $C_0$.

The spectral power density $S_0$ of the noise provided by source $S_b$ is equal to:

$$S_0 = 4kTR_{ON} \quad (4)$$

where k is Boltzmann's constant and T is temperature.

The noise power spectral density $S_1$ at the output of circuit 12 is equal to:

$$S_1 = \frac{S_0}{1 + \left(\frac{f}{f_C}\right)^2} \quad (5)$$

Figure 3:
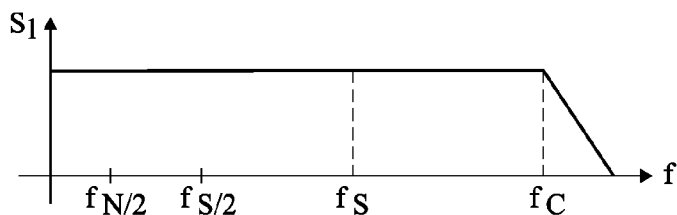
FIG. 3 schematically shows the variation of the noise power spectral density at the output of the circuit of FIG. 2.

FIG. 3 schematically shows the variation of noise spectral density $S_1$. After sampling at frequency $f_S$, noise power spectral density $S_2$ at the output of circuit 10 is provided by the following relation:

$$S_2(f) = S_0 \sum_{n=-\infty}^{n=+\infty} \frac{1}{1 + \left(\frac{f - nf_S}{f_C}\right)^2} \quad (6)$$

Call $f_N/2$ the maximum frequency of the useful signal to be transmitted. To respect Shannon's sampling criterion, frequency $f_N/2$ must be smaller than half sampling frequency $f_S$. Relation (6) shows an aliasing in the useful band of the thermal noise due to the sub-sampling of the wide-band noise.

In practice, frequency $f_N$ is much smaller than sampling frequency $f_S$. As an example, frequency $f_S$ is on the order of 1 MHz and frequency $f_N$ is on the order of 1 kHz. An approached value of the RMS value of the noise voltage at the output of circuit $V_b$ can be determined in a simple way. First, the sampling is not taken into account. The RMS value of noise voltage $V_b$ at the output of circuit 12 is provided by the following relation:

$$V_b = \sqrt{\int_0^{+\infty} S_1(f) df} = \sqrt{S_0 \int_0^{+\infty} \frac{1}{1 + \left(\frac{f}{f_C}\right)^2} df} \quad (7)$$

$$= \sqrt{S_0 f_C \frac{\pi}{2}}$$

$$= \sqrt{\frac{kT}{C_0}}$$

The noise being sampled at frequency $f_S$, the noise is taken back into frequency band $[0, f_S/2]$. Further, the useful signal being in frequency band $[0, f_N/2]$, only part of the noise is kept. The RMS value of the aliased noise voltage corresponds to:

$$V_b = \sqrt{\frac{kT}{C_0 \frac{f_s}{f_c}}} \quad (8)$$

A possibility to decrease the RMS value of noise voltage $V_b$ is to increase capacitance $C_0$. Typically, to obtain an SNR greater than some hundred decibels, capacitance $C_0$ must be greater than some hundred picofarads. A disadvantage is that circuit 10 generally belongs to a circuit comprising other capacitors having values depending on $C_0$. For example, circuit 10 may belong to an integrator, possibly comprising another capacitor, called integration capacitor, having a capacitance that can be equal to approximately 10 times $C_0$. The integrated forming of capacitors having high capacitances, for example, greater than several hundreds of picofards, is difficult. Further, the increase in the capacitances of the capacitors of switched-capacitor circuits results in an increase in the total circuit consumption. This may be incompatible with applications for which the total circuit consumption is critical.

To increase the SNR of a switched-capacitor circuit without increasing the capacitance of the circuit capacitor, the applicant has first attempted to replace capacitor $C_0$ with two series-assembled capacitors to form a capacitive bridge.

Figure 4:
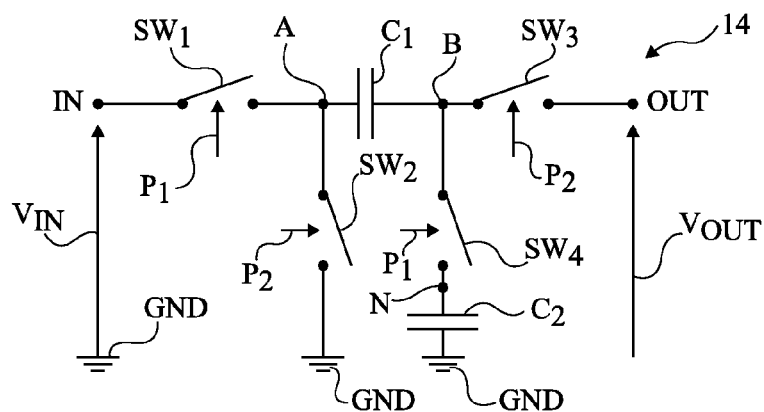
FIGS. 4 and 5 are drawings respectively similar to FIGS. 1 and 2 of a variation of the circuit of FIG. 1.

FIG. 4 shows a switched-capacitor circuit 14 having a structure similar to that of circuit 10 of FIG. 1, with the difference that capacitor $C_0$ has been replaced with a capacitor $C_1$ and that a capacitor $C_2$ has been added between switch $SW_4$ and ground GND. Capacitance $C_1$ is greater than capacitance $C_2$. As an example, capacitance $C_1$ may be equal to ten times capacitance $C_2$. A node located between switch $SW_4$ and capacitor $C_2$ is designated as N.

Figure 5:
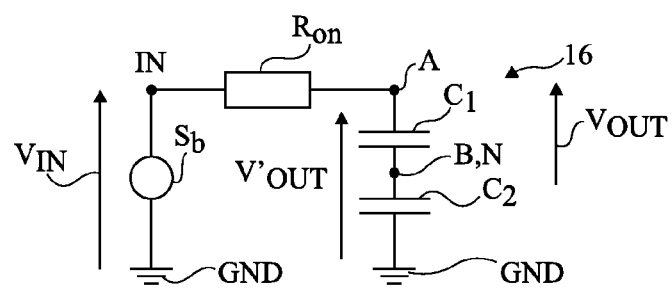

FIG. 5 is an electric diagram 16 equivalent to circuit 14 when switches $SW_1$ and $SW_4$ are on and which illustrates the operation thereof. Voltage $V_{OUT}$ corresponds to the voltage across capacitor $C_1$. Call $V'_{OUT}$ the voltage between node A and ground GND.

Transfer function H' of circuit 16 is:

$$H'(f) = \frac{V_{OUT}}{V_{IN}} = \frac{V_{OUT}}{V'_{OUT}} \frac{V'_{OUT}}{V_{IN}} = \frac{C_2}{C_2 + C_1} \frac{1}{1 + j\frac{f}{f'_C}} \quad (9)$$

where $f'_C$ is the cut-off frequency of the low-pass filter formed by resistor $R_{ON}$ and capacitors $C_1$ and $C_2$. At low frequencies, transfer function H' of circuit 16 is substantially equal to transfer function H of circuit 12 multiplied by attenuation factor $C_2/(C_1+C_2)$. When capacitance $C_1$ is equal to 10 times capacitance $C_2$, the attenuation factor is 1/11. The capacitive bridge formed by capacitors $C_1$ and $C_2$ thus enables to decrease the contribution of noise across capacitor $C_1$. A 21-dB gain on the noise is thus obtained. However, the amplitude of the useful signal at low frequencies is also decreased by 21 decibels. The SNR of circuit 16 is thus not improved with respect to that of circuit 12.

The applicant has demonstrated that all of the useful low-frequency signal and only part of the high-frequency noise across capacitor $C_1$ could be obtained by connecting node N between capacitors $C_1$ and $C_2$ to a "virtual low-frequency ground".

Figure 6:
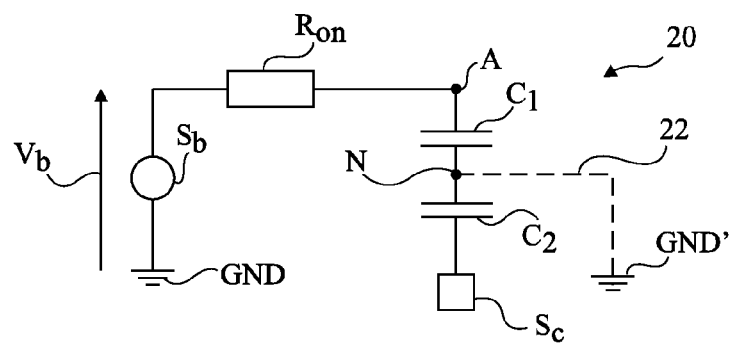
FIG. 6 shows an electric circuit illustrating the operating principle of a switched-capacitor circuit according to the present invention.

FIG. 6 shows a circuit 20 illustrating the principle of a virtual low-frequency ground. Node N is connected to a virtual low-frequency ground GND' by a line 22 shown in dotted lines. Capacitor $C_2$, on the side opposite to node N, is connected to a circuit $S_C$. For low frequencies, virtual ground GND' is equivalent to ground GND. Everything happens as if node N was then directly connected to ground GND, short-circuiting capacitor $C_2$. For high frequencies, everything happens as if ground GND' was not present and as if node B was normally connected to capacitor $C_2$. At high frequencies, circuit $S_C$ maintains the armature of capacitor $C_2$ at a fixed voltage. The low-frequency components and especially the useful signal are thus only seen by capacitor $C_1$ while the high-frequency components (and, in particular, the high-frequency components of the wide-band thermal noise) are shared between capacitors $C_1$ and $C_2$. Advantage is thus taken of the attenuation of the high-frequency components of the noise without for the useful signal to be attenuated. Thereby, at the aliasing of the spectrum due to the sampling, the contribution of the high-frequency noise in the useful frequency band is decreased. Thereby, to obtain a given SNR, capacitance $C_1$ of circuit 20 according to the present invention may be smaller, for example, up to ten times, than capacitance $C_0$ of conventional circuit 10. The capacitances of capacitors $C_1$ and $C_2$ being low, the integrated manufacturing of circuit 20 is eased and the consumption of circuit 20 is decreased.

According to an embodiment the virtual "low frequency" ground is formed by a differential-input amplifier having an input connected to node N and having its other input connected to ground GND. Call main cut-off frequency the lowest frequency for which the amplifier gain falls by 3 dB with respect to the maximum amplifier gain. The amplifier may comprise active components (for example, an operational amplifier) and possibly passive components (resistor, capacitor, etc.).

Figure 7:
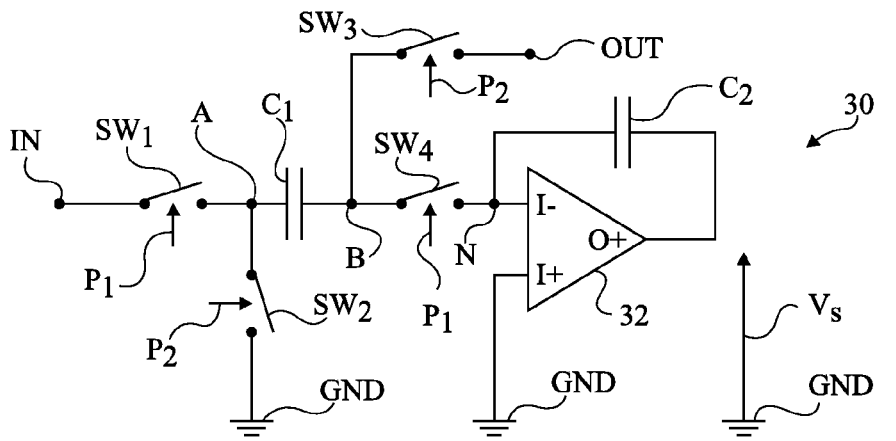
FIG. 7 shows an embodiment of a switched-capacitor circuit according to the present invention.

FIG. 7 shows an embodiment of a switched-capacitor circuit 30 with a virtual ground. Circuit 30 comprises all the elements of circuit 14 of FIG. 4, but node N is connected to an inverting input I− of an operational amplifier 32. Non-inverting input I+ of operational amplifier 32 is connected to ground GND. Capacitor $C_2$ is provided between node N and output O+ of operational amplifier 32. Conventionally, operational amplifier 32 has a cut-off frequency $f'_C$ on the order of from 1 to a few Megahertz, for example, 2 MHz, which is smaller than cut-off frequency $f_C$ and is greater than half switching frequency $f_S$ of switches $SW_1$ to $SW_4$. In the following description, frequencies smaller than cut-off frequency $f'_C$ are called low frequencies and frequencies greater than cut-off frequency $f'_C$ are called high frequencies The operation of circuit 30 will be described when switches $SW_1$ and $SW_4$ are on. For frequencies smaller than cut-off frequency $f'_C$, operational amplifier 32 operates normally. In particular, the voltages at inverting and non-inverting inputs I− and I+ of operational amplifier 32 are equal. Node N is thus effectively directly connected to ground GND. For frequencies greater than cut-off frequency $f'_C$, operational amplifier 32 no longer operates properly, and everything happens as if it was not present, with output O+ being at high impedance. The high-frequency components are thus well distributed between capacitors $C_1$ and $C_2$.

Figure 8:
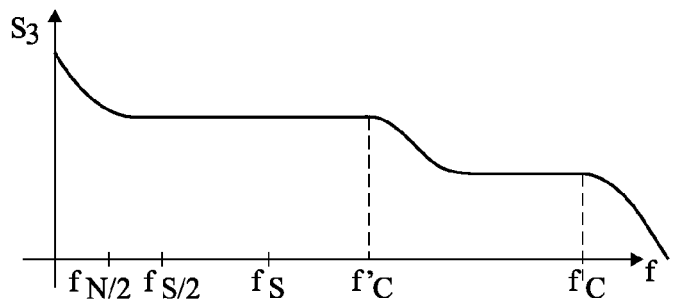
FIG. 8 schematically shows the variation of the noise power spectral density at the output of the circuit of FIG. 7.

FIG. 8 schematically shows an example of the variation of the noise power spectral density $S_3$ at the output of circuit 30 without taking the sampling into account. At low frequencies, the 1/f noise contribution of operational amplifier 32, also called flicker noise, can be observed. The amplitude of noise power spectral density $S_3$ at the output of circuit 30 decreases for frequencies greater than $f'_C$. In the sampling, the high-frequency components of the thermal noise are aliased on interval $[0, f_S/2]$. Due to the fact that these high-frequency components have been attenuated, their contribution in useful band $[0, f_N/2]$ is decreased.

Capacitance $C_2$ should advantageously be as low as possible with respect to $C_1$ to improve the attenuation of the high-frequency components. However, when switches $SW_1$ and $SW_4$ are on, voltage $V_S$ at output O+ of the amplifier is equal to:

$$V_S = -\frac{C_1}{C_2} V_{IN} \quad (10)$$

so that if the ratio of capacitances $C_1$ and $C_2$ is too high, operational amplifier 32 risks saturating.

Figure 9:
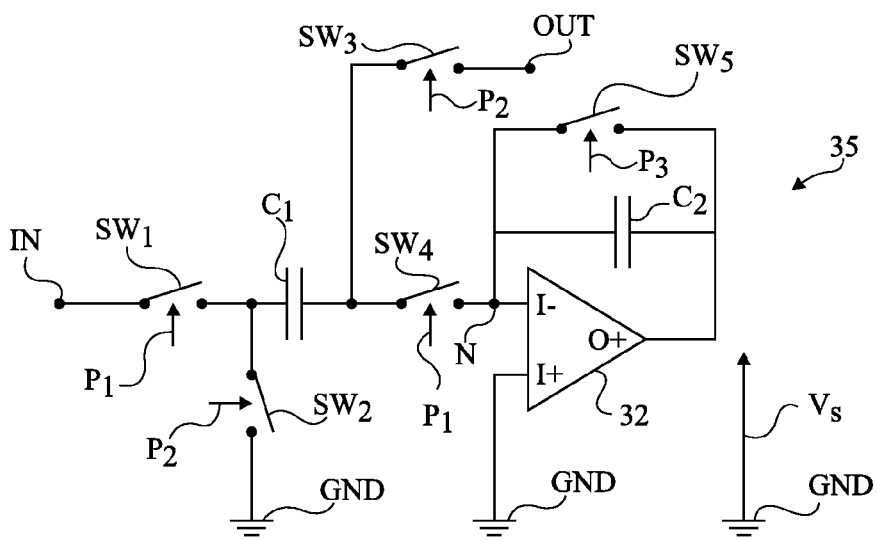
FIG. 9 shows an alternative embodiment of the circuit of FIG. 7.

FIG. 9 shows a switched-capacitor circuit 35 corresponding to a variation of circuit 30 of FIG. 7 in which a switch $SW_5$ is arranged across capacitor $C_2$. Switch $SW_5$ is controlled by a control signal $P_3$. During time $\alpha T_S$ for which signal $P_1$ is in the high state, signal $P_3$ is in the low state (switch $SW_5$ off) for a time period $\beta \alpha T_S$, $\beta$ being strictly smaller than 1, and then in the high state (switch $SW_5$ off) for time period $(1-\beta)\alpha T_S$. During time period $(1-\alpha)T_S$ for which signal $P_1$ is in the low state, signal $P_3$ is in the high state (switch $SW_5$ off). Value $\beta$ is selected so that capacitor $C_2$ does not have time to completely charge during time period $\beta \alpha T_S$ so that voltage $V_S$ does not reach too high values, likely to cause the saturation of operational amplifier 32. For a conventional operational amplifier 32, and for a ratio $C_1/C_2$ equal to 10, $\beta$ may be on the order of 1/2.

Figure 10:
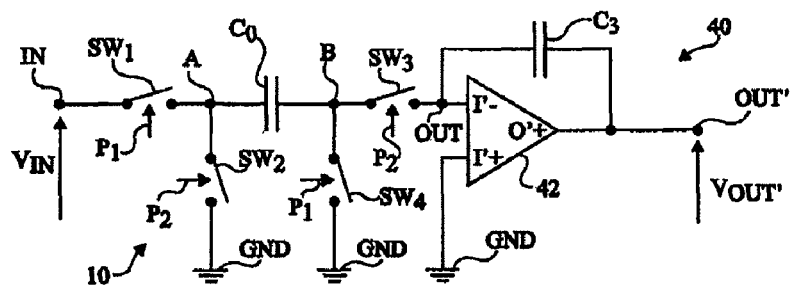
FIGS. 10 and 12 show two conventional embodiments of an integrator with switched capacitors.

FIG. 10 shows a conventional example of application of switched-capacitor circuit 10 of FIG. 1 for the forming of an integrator 40. Terminal OUT of circuit 10 is connected to inverting input I'− of an operational amplifier 42. Non-inverting input I'+ of operational amplifier 42 is connected to ground GND. A capacitor $C_3$ is provided between inverting input I'− and an output terminal OUT' of integrator 40. Output O'+ of operational amplifier 42 is connected to terminal OUT'.

The operation of integrator 40 will now be schematically described, assuming that voltage $V'_{OUT}$ is initially equal to $V_0$ and considering that signal $P_1$ is in the low state (signal $P_2$ in the high state). Switches $SW_1$ and $SW_4$ are then off and switches $SW_2$ and $SW_3$ are on. The charge stored in the right-hand armature of capacitor $C_0$ shown to the right of FIG. 10 is zero and the charge stored in the armature of capacitor $C_3$ shown to the left of FIG. 10 is equal to $-C_3 V_0$.

When signal $P_1$ switches to the high state ($P_2$ in the low state), which corresponds to an accumulation phase, switches $SW_1$ and $SW_4$ are on and switches $SW_2$ and $SW_3$ are off. Capacitors $C_0$ and $C_3$ are separate. Charge $-C_3 V_0$ remains trapped on the left-hand armature of capacitor $C_3$. The voltage at terminal OUT' does not change. Further, capacitor $C_0$ charges and the right-hand armature of capacitor $C_0$ receives charge $-C_0 V_{IN}$.

When signal $P_1$ switches back to the low state ($P_2$ in the high state), which corresponds to an integration phase, capacitors $C_0$ and $C_3$ are connected to each other again. The output voltage of amplifier 42 then switches to $V'_{OUT}$. The balance of the charges between capacitors $C_0$ and $C_3$ can be written as:

$$0 - C_3 V'_{OUT} = -C_0 V_{IN} - C_3 V_0 \quad (11)$$

that is:

$$V'_{OUT} = V_0 + (C_0/C_3) V_{IN} \quad (12)$$

At each switching cycle of switches $SW_1$ to $SW_4$, voltage $V'_{OUT}$ is equal to the sum of the value of the preceding cycle and of a term proportional to $V_{IN}$. An integrator operation is thus obtained.

Figure 11:
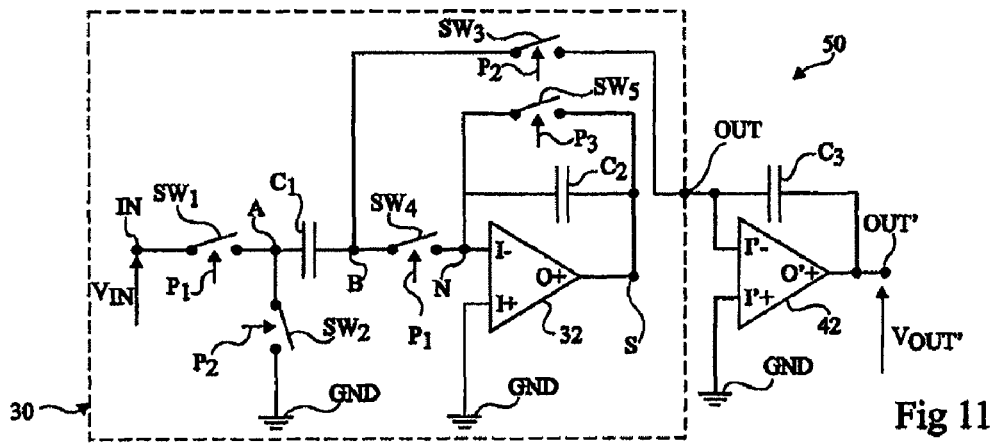
FIGS. 11 and 13 show two embodiments of an integrator with switched capacitors according to the present invention.

FIG. 11 shows an embodiment of an integrator 50 of the type shown in FIG. 10, implementing circuit 30 shown in FIG. 9. For this purpose, output terminal OUT of circuit 30 is connected to inverting input I'− of operational amplifier 42.

The operation of circuit 50 will now be described. When signal $P_1$ is in the high state during time $\alpha T_S$, that is, during the acquisition phase, switches $SW_1$ and $SW_4$ are on and switches $SW_2$ and $SW_3$ are off. Circuit 30 is not connected to operational amplifier 42 and operates as described previously. More specifically, switch $SW_5$ is off during time $\beta \alpha T_S$ and is on during time $(1-\beta)\alpha T_S$.

When signal $P_1$ is in the low state for time $(1-\alpha)T_S$, that is, during the integration phase, switches $SW_1$ and $SW_4$ are off and switches $SW_2$, $SW_5$, and $SW_3$ are on. Node B is no longer connected to node N and capacitor $C_1$ is connected to operational amplifier 42 identically to what has been previously described for capacitor $C_0$ of circuit 40. The high-frequency noise components which might be present during the integration phase are filtered by operational amplifier 42.

Figure 12:
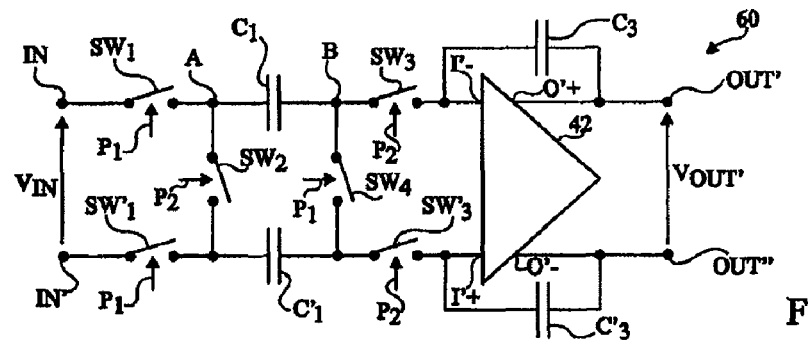

FIG. 12 shows a conventional embodiment of an integrator 60 having a differential structure. Integrator 60 comprises the elements of circuit 40 and, further, a capacitor $C'_1$ having an armature connected to an input terminal IN' by a switch $SW'_1$ and is connected to switch $SW'_2$. The other armature of capacitor $C'_1$ is connected to non-inverting input I'+ of differential amplifier 32 via a switch $SW'_3$ and to switch $SW'_4$. Switch $SW'_1$ is controlled by signal $P_1$ and switch $SW'_3$ is controlled by switch $P_2$. Inverting input I'− of operational amplifier 42 is connected to an output terminal OUT". A capacitor $C'_3$ is provided between non-inverting input I'+ and inverting output O'− of operational amplifier 42. The operation of integrator 60 is identical to that of integrator 40, the role of ground GND for integrator 40 being played, in this case, by the common-mode voltage of operational amplifier 42.

Figure 13:
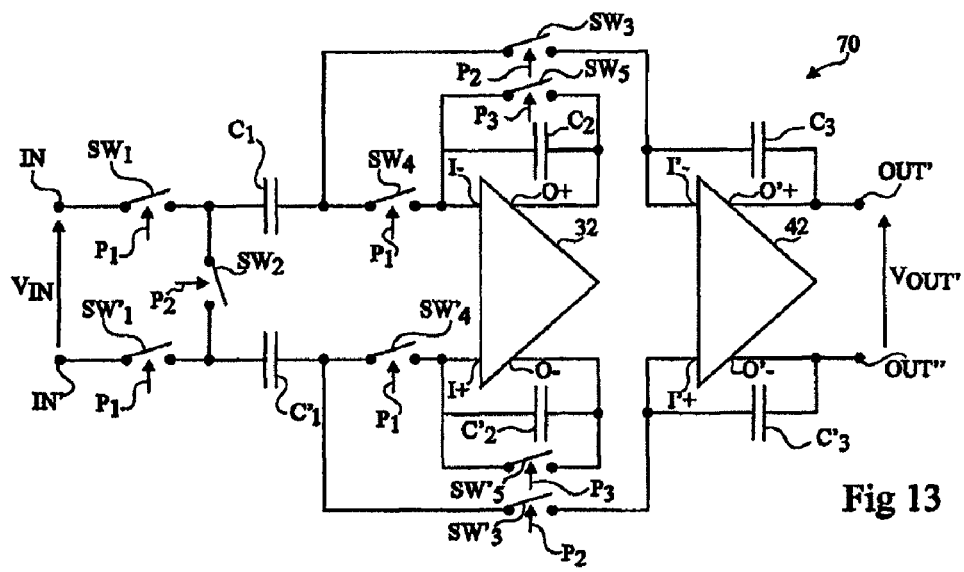

FIG. 13 shows the use of circuit 30 according to the present invention arranged in differential form for the forming of a positive differential integrator 70. Integrator 70 comprises the elements of circuit 60 and, further, a switch $SW'_4$ connecting capacitor $C'_1$ to non-inverting input I+ of operational amplifier 32. Integrator 70 further comprises a capacitor $C'_2$ arranged between non-inverting input I+ and inverting output O− of operational amplifier 32 and a switch $SW'_5$ arranged across capacitor $C'_2$. Switch $SW'_5$ is controlled by signal $P_3$. The operation of integrator 70 is identical to that of integrator 50, the role of ground GND for integrator 40 being played, in this case, by the common-mode voltage of operational amplifier 42.

The present invention enables to decrease the contribution of the high-frequency noise in the frequency band of the useful signal. Thereby, for a same SNR, it enables to decrease capacitance $C_1$ of circuit 30, 35 with respect to capacitance $C_0$ of circuit 10. In the present embodiment, capacitance $C_1$ may be ten times smaller than capacitance $C_0$. Further, when the switched-capacitor circuit is used to form an integrator, integration capacitance $C_3$ may be advantageously decreased with respect to a conventional circuit, for example, by a factor 10. More generally, the use of the switched-capacitor circuit according to the present invention in an electronic system may enable to decrease the capacitances of other capacitors of the electronic system. The present invention advantageously enables to decrease the surface area necessary to make switched-capacitor circuit 40 in integrated form, the surface area taken up by operational amplifier 32 being substantially equivalent to the surface area taken up by a capacitor having a capacitance of a few picofarads.

The present invention further provides a consumption gain on the order of from 7 to 8 with respect to a conventional switched-capacitor circuit. The circuit consumption is not exactly decreased by capacitance ratio $C_1/C_2$ since the consumption of operational amplifier 32 must be taken into account. Further, when the switched-capacitor circuit corresponds to a stage of an electronic system comprising several successive stages, the decrease in the input capacitance of the switched-capacitor circuit enables to decrease the constraints on the stage preceding the switched-capacitor circuit, for example, a pre-amplifier.

Specific embodiments of the present invention have been described. Different variations and modifications will occur to those skilled in the art. In particular, although an example of a switched-capacitor circuit comprising four switches $SW_1$ to $SW_4$ has been described, it should be clear that the present invention can apply to a switched-capacitor circuit in which a same armature of capacitor $C_1$ is switched between terminals IN and OUT, the other armature of capacitor $C_1$ being then connected to inverting input I− of operational amplifier 32.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A switched-capacitor circuit comprising:
input, ground and output terminals;
a first capacitor comprising first and second armatures;
a second capacitor connected to the second armature of the first capacitor at a node;
a first switch connecting the input terminal to the first armature of the first capacitor, wherein the first switch is responsive to a first signal at a switching frequency;
a second switch connecting the ground terminal to the first armature of the first capacitor, wherein the second switch is responsive to a second signal at the switching frequency, the second signal being different from the first signal, and the first and second signals having non-overlapping phases;
a third switch directly connecting the second armature of the first capacitor to the output terminal;
a filtering circuit connecting said node to a virtual ground only during first phases of the first signal, these first phases being the phases of signal storage of said input in the first capacitor; and
a fourth switch connecting the node to the second armature of the first capacitor, the first and fourth switches being controlled by the first signal and the second and third switches being controlled by the second signal, wherein the first and second signals are binary signals.

2. The circuit of claim 1, wherein the filtering circuit is adapted for connecting the node to the virtual ground only for frequencies smaller than a threshold frequency greater than half the switching frequency.

3. The circuit of claim 2, wherein the filtering circuit comprises an amplifier with differential inputs having an input connected to the node and having a main cut-off frequency, the threshold frequency of the filtering circuit corresponding to the main cut-off frequency.

4. The circuit of claim 1, wherein the filtering circuit comprises at least one active filter comprising at least one active electronic component and at least one passive filter comprising at least one passive electronic component.

5. The circuit of claim 1, wherein the capacitance of the second capacitor is smaller than the capacitance of the first capacitor.

6. The circuit of claim 1, wherein the filtering circuit comprises an operational amplifier comprising an input connected to said node and an output connected to said input via the second capacitor, wherein a threshold frequency of the filtering circuit corresponds to a cut-off frequency of the operational amplifier.

7. The circuit of claim 6, wherein the ground terminal is connected to a source of a reference voltage and wherein the operational amplifier comprises an additional input connected to said source of the reference voltage.

8. The circuit of claim 1, further comprising a fifth switch across the second capacitor, the fifth switch being on, when the first and fourth switches are on, for a first time period and off for a second time period.

9. The circuit of claim 6, further comprising:
a third capacitor comprising third and fourth armatures, the operational amplifier comprising an additional input connected to an additional node and an additional output connected to the additional input via a fourth capacitor;
fourth and fifth terminals;
a sixth switch controlled by the first signal connecting the fourth terminal to the third armature of the third capacitor;
a seventh switch controlled by the second signal connecting the fifth terminal to the fourth armature of the third capacitor; and
an eighth switch controlled by the first signal connecting the additional node to the fourth armature of the third capacitor, the second terminal being located between the third armature of the third capacitor and the fifth switch.

10. A switched-capacitor circuit comprising:
input, ground and output terminals;
a first capacitor comprising first and second armatures;
a second capacitor connected to the second armature of the first capacitor at a node;
a first switch connecting the input terminal to the first armature of the first capacitor, wherein the first switch is responsive to a first signal at a switching frequency;
a second switch connecting the ground terminal to the first armature of the first capacitor, wherein the second switch is responsive to a second signal at the switching frequency, the second signal being different from the first signal, and the first and second signals having non-overlapping phases;
a third switch directly connecting the second armature of the first capacitor to the output terminal;
a filtering circuit connecting said node to a virtual ground only during first phases of the first signal, these first phases being the phases of signal storage of said input in the first capacitor, wherein the filtering circuit comprises an operational amplifier comprising an input connected to said node and an output connected to said input via the second capacitor, wherein a threshold frequency of the filtering circuit corresponds to a cut-off frequency of the operational amplifier; and
a fifth switch across the second capacitor, the fifth switch being on, when the first and fourth switches are on, for a first time period and off for a second time period.

11. The circuit of claim 10, wherein the filtering circuit is adapted for connecting the node to the virtual ground only for frequencies smaller than a threshold frequency greater than half the switching frequency.

12. The circuit of claim 11, wherein the filtering circuit comprises an amplifier with differential inputs having an input connected to the node and having a main cut-off frequency, the threshold frequency of the filtering circuit corresponding to the main cut-off frequency.

13. The circuit of claim 10, wherein the filtering circuit comprises at least one active filter comprising at least one active electronic component and at least one passive filter comprising at least one passive electronic component.

14. The circuit of claim 10, wherein the capacitance of the second capacitor is smaller than the capacitance of the first capacitor.

15. The circuit of claim 10, wherein the ground terminal is connected to a source of a reference voltage and wherein the operational amplifier comprises an additional input connected to said source of the reference voltage.

16. The circuit of claim 10, further comprising:
a third capacitor comprising third and fourth armatures, the operational amplifier comprising an additional input connected to an additional node and an additional output connected to the additional input via a fourth capacitor;
fourth and fifth terminals;
a sixth switch controlled by the first signal connecting the fourth terminal to the third armature of the third capacitor;
a seventh switch controlled by the second signal connecting the fifth terminal to the fourth armature of the third capacitor; and
an eighth switch controlled by the first signal connecting the additional node to the fourth armature of the third capacitor, the second terminal being located between the third armature of the third capacitor and the fifth switch.

17. A switched-capacitor circuit comprising:
input, ground and output terminals;
a first capacitor comprising first and second armatures;
a second capacitor connected to the second armature of the first capacitor at a node;
a first switch connecting the input terminal to the first armature of the first capacitor, wherein the first switch is responsive to a first signal at a switching frequency;
a second switch connecting the ground terminal to the first armature of the first capacitor, wherein the second switch is responsive to a second signal at the switching frequency, the second signal being different from the first signal, and the first and second signals having non-overlapping phases;
a third switch directly connecting the second armature of the first capacitor to the output terminal;
a filtering circuit connecting said node to a virtual ground only during first phases of the first signal, these first phases being the phases of signal storage of said input in the first capacitor, wherein the filtering circuit comprises an operational amplifier comprising an input connected to said node and an output connected to said input via the second capacitor, wherein a threshold frequency of the filtering circuit corresponds to a cut-off frequency of the operational amplifier;
a third capacitor comprising third and fourth armatures, the operational amplifier comprising an additional input connected to an additional node and an additional output connected to the additional input via a fourth capacitor;
fourth and fifth terminals;
a sixth switch controlled by the first signal connecting the fourth terminal to the third armature of the third capacitor;
a seventh switch controlled by the second signal connecting the fifth terminal to the fourth armature of the third capacitor; and
an eighth switch controlled by the first signal connecting the additional node to the fourth armature of the third capacitor, the second terminal being located between the third armature of the third capacitor and the fifth switch.

18. The circuit of claim 17, wherein the filtering circuit is adapted for connecting the node to the virtual ground only for frequencies smaller than a threshold frequency greater than half the switching frequency.

19. The circuit of claim 18, wherein the filtering circuit comprises an amplifier with differential inputs having an input connected to the node and having a main cut-off frequency, the threshold frequency of the filtering circuit corresponding to the main cut-off frequency.

20. The circuit of claim 17, wherein the filtering circuit comprises at least one active filter comprising at least one active electronic component and at least one passive filter comprising at least one passive electronic component.

21. The circuit of claim 17, wherein the capacitance of the second capacitor is smaller than the capacitance of the first capacitor.

22. The circuit of claim 17, wherein the ground terminal is connected to a source of a reference voltage and wherein the operational amplifier comprises an additional input connected to said source of the reference voltage.

23. The circuit of claim 17, further comprising a fifth switch across the second capacitor, the fifth switch being on, when the first and fourth switches are on, for a first time period and off for a second time period.

* * * * *